US010809631B2

(12) United States Patent
Mos et al.

(10) Patent No.: US 10,809,631 B2
(45) Date of Patent: Oct. 20, 2020

(54) METHOD OF MONITORING AND DEVICE MANUFACTURING METHOD

(71) Applicant: ASML NETHERLANDS B.V., Veldhoven (NL)

(72) Inventors: Everhardus Cornelis Mos, Best (NL); Jochem Sebastiaan Wildenberg, Aarle-Rixtel (NL); Marcel Hendrikus Maria Beems, Veldhoven (NL); Erik Johannes Maria Wallerbos, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 262 days.

(21) Appl. No.: 15/951,343

(22) Filed: Apr. 12, 2018

(65) Prior Publication Data
US 2018/0307145 A1 Oct. 25, 2018

(30) Foreign Application Priority Data
Apr. 25, 2017 (EP) ..................................... 17167879

(51) Int. Cl.
*G03F 7/20* (2006.01)
(52) U.S. Cl.
CPC .......... *G03F 7/70625* (2013.01); *G03F 7/705* (2013.01); *G03F 7/70508* (2013.01); *G03F 7/70516* (2013.01); *G03F 7/70616* (2013.01); *G03F 7/70633* (2013.01); *G03F 7/70891* (2013.01)

(58) Field of Classification Search
CPC .. G03F 7/705; G03F 7/70508; G03F 7/70516; G03F 7/70616; G03F 7/70625; G03F 7/70633; G03F 7/70891
See application file for complete search history.

(56) References Cited

U.S. PATENT DOCUMENTS 6,597,447 B1 * 7/2003 Stirton ................... G01B 11/00
                                                    356/237.2
6,673,638 B1 * 1/2004 Bendik ............... G03F 7/70625
                                                    430/30

(Continued)

FOREIGN PATENT DOCUMENTS

KR           20130113984            10/2013

OTHER PUBLICATIONS

Extended European Search Report dated Oct. 11, 2017 in corresponding European Application No. 17167879.0.
(Continued)

*Primary Examiner* — Gordon J Stock, Jr.
(74) *Attorney, Agent, or Firm* — Pillsbury Wilthrop Shaw Pittman LLP

(57) ABSTRACT

A method of monitoring a device manufacturing process, the method including; obtaining an estimated time variation of a process parameter; determining, on the basis of the estimated time variation, a sampling plan for measurements to be performed on a plurality of substrates to obtain information about the process parameter; measuring substrates in accordance with the sampling plan to obtain a plurality of measurements; and determining an actual time variation of the process parameter on the basis of the measurements.

21 Claims, 4 Drawing Sheets

(56) References Cited

U.S. PATENT DOCUMENTS

Figure 1:
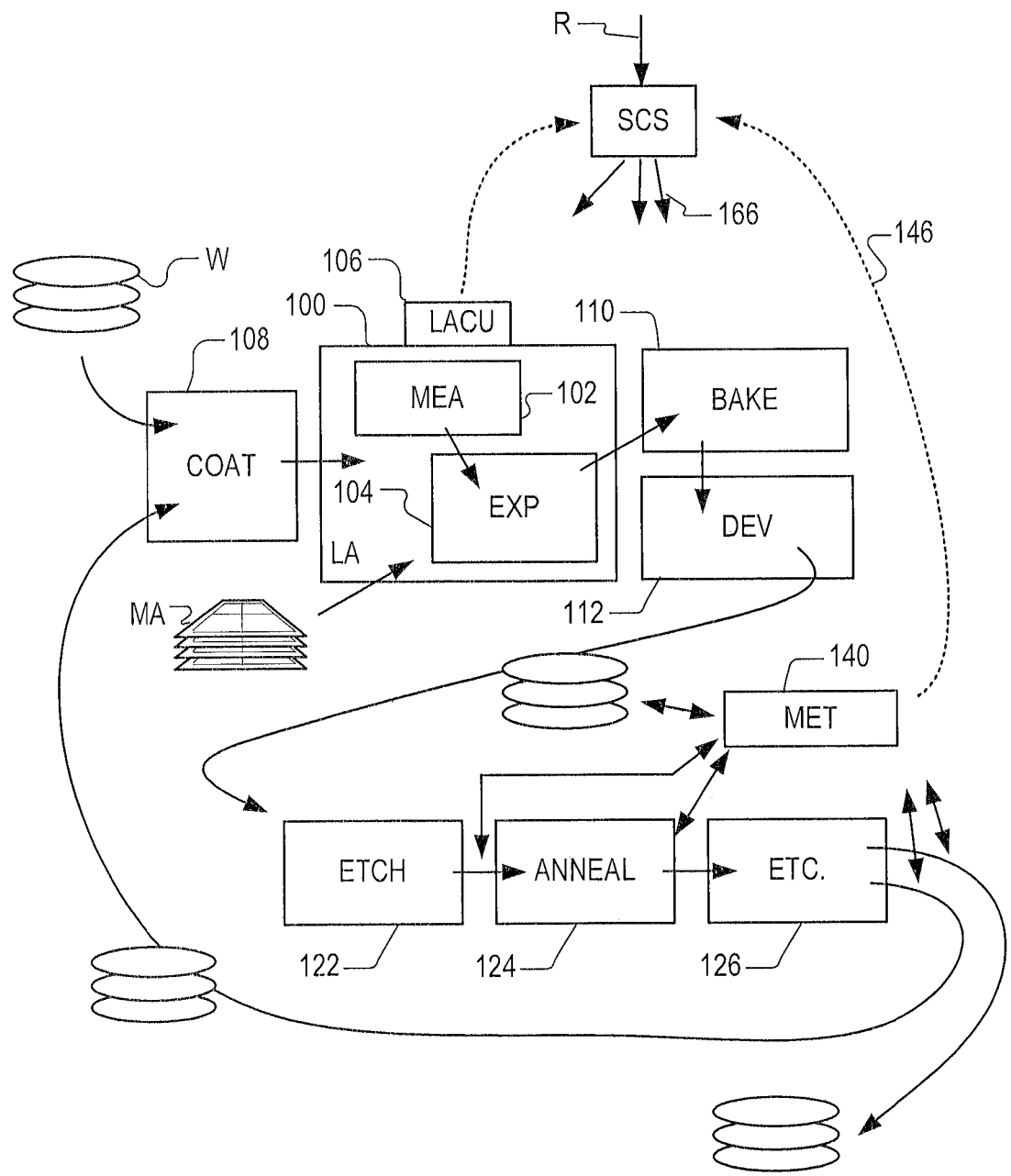

| | | | |
|---|---|---|---|
| 6,710,849 B2* | 3/2004 | Kwan | G03F 7/70733 355/53 |
| 7,829,249 B2 | 11/2010 | Van De Kerkhof et al. | |
| 8,636,458 B2* | 1/2014 | Auer-Jongepier | H01L 21/67178 414/217 |
| 9,177,219 B2 | 11/2015 | Tel et al. | |
| 9,417,533 B2 | 8/2016 | Prosyentsov et al. | |
| 2008/0036983 A1* | 2/2008 | De Mast | G03F 7/70525 355/53 |
| 2008/0220345 A1 | 9/2008 | Van De Kerkhof et al. | |
| 2009/0135424 A1* | 5/2009 | Kiers | G01N 21/47 356/388 |
| 2011/0205511 A1* | 8/2011 | Padiy | G03F 7/70633 355/53 |
| 2012/0008127 A1 | 1/2012 | Tel et al. | |
| 2012/0133914 A1 | 5/2012 | Prosyentsov et al. | |
| 2012/0303151 A1* | 11/2012 | Ye | B29C 64/386 700/119 |
| 2012/0327383 A1* | 12/2012 | Cao | G03F 7/705 355/67 |
| 2014/0313496 A1* | 10/2014 | Gijsbertsen | G03F 7/70625 355/55 |
| 2015/0079700 A1* | 3/2015 | Ke | G03F 1/36 438/5 |
| 2017/0082921 A1* | 3/2017 | Kim | G03F 1/78 |
| 2018/0217508 A1* | 8/2018 | Urbanczyk | G03F 7/70525 |
| 2018/0224752 A1* | 8/2018 | Tel | G03F 7/70525 |

OTHER PUBLICATIONS

Vincent, Tyrone L. et al., "Metrology Sampling Strategies for Process Monitoring Applications", IEEE Transactions on Semiconductor Manufacturing, vol. 24, No. 4, pp. 489-498 (2011).

Korean Notice of Allowance issued in corresponding Korean Patent Application No. 10-2018-0047113, dated Aug. 24, 2020.

* cited by examiner

METHOD OF MONITORING AND DEVICE MANUFACTURING METHOD

This application claims the benefit of priority of European patent application no. 17167879, filed Apr. 25, 2017, the content of which is incorporated herein in its entirety by reference.

FIELD

The present description relates to device manufacturing using lithographic apparatus and in particular to monitoring device manufacturing methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

SUMMARY

In lithographic processes, even the smallest variations in the conditions in the lithographic apparatus prevailing when an exposure of a substrate is carried out can have an undesirable effect on the resulting device pattern. That some conditions in the lithographic apparatus can change over time, both during the course of exposures of a single substrate and from substrate to substrate in spite of the lithographic apparatus being equipped with systems configured to keep the conditions constant. Therefore, both feedforward and/or feedback control systems can be used to compensate for changes in the conditions in a lithographic apparatus. However, in view of the continual desire in the device manufacturing industry to reduce the size of features (shrink) that can be formed in a device, improvements in measuring and compensating for time-varying conditions in a lithographic apparatus are desirable.

Embodiments of the invention aim to, for example, improve measuring and compensating for time-varying conditions of a lithographic device manufacturing process.

In an aspect, there is provided a method of monitoring a device manufacturing process, the method comprising:

obtaining an estimated time variation of a process parameter;

determining, on the basis of the estimated time variation, a sampling plan for measurements to be performed on a plurality of substrates to obtain information about the process parameter;

measuring substrates in accordance with the sampling plan to obtain a plurality of measurements; and determining an actual time variation of the process parameter on the basis of the measurements.

In an aspect, there is provided a method of monitoring a device manufacturing process, the method comprising:

measuring a substrate at a plurality of positions on one or more substrates of a batch of substrates to obtain a plurality of measurements relating to a process parameter;

determining the relative times of exposures of the positions on the one or more substrates with reference to a trajectory of the substrates during exposures and/or an order of exposure of substrates in the batch; and determining an actual time variation of the process parameter on the basis of the measurements and the relative times.

In an aspect, there is provided a device manufacturing method comprising:

performing a sequence of exposures on one or more substrates using a lithographic apparatus;

monitoring the exposures using a method as described herein;

adjusting a control parameter of the lithographic apparatus on the basis of the determined actual time variation; and performing further exposures on one or more substrates using the lithographic apparatus.

In an aspect, there is provided a computer program comprising computer readable code for instructing one or more lithographic tools to perform a method as described herein.

In an aspect, there is provided an inspection apparatus configured for measuring a property of a substrate, the inspection apparatus comprising:

an illumination system configured to illuminate a substrate with radiation;

a detection system configured to detect scattering properties arising from the illumination; and a processor configured to control the inspection apparatus to perform a method as described herein.

The different aspects provide solutions to, for example, the problem of improving accuracy in predicting a time-varying process parameter, e.g. so that it can be controlled or compensated for. In one aspect a sample plan is derived to optimize measurements to improve the modelling of the time-varying process parameter. In a further aspect additional information is taken into account when using existing measurements.

BRIEF DESCRIPTION OF THE DRAWINGS/FIGURES

Figure 2:
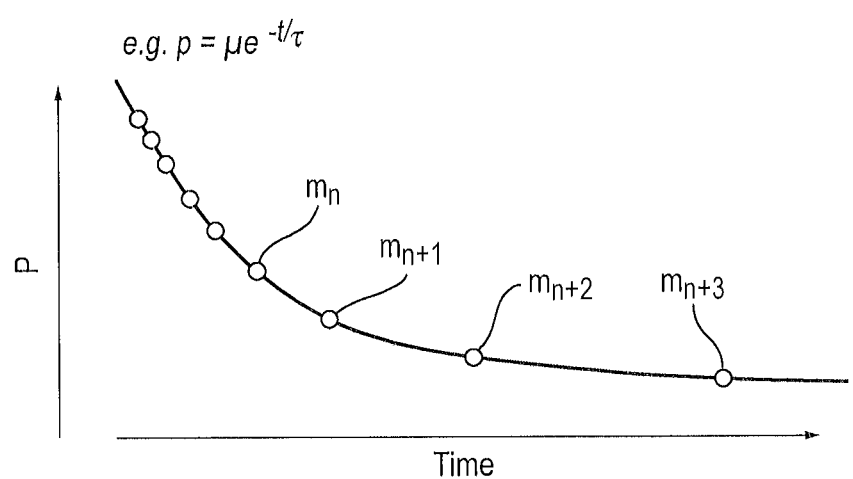
Figure 3:
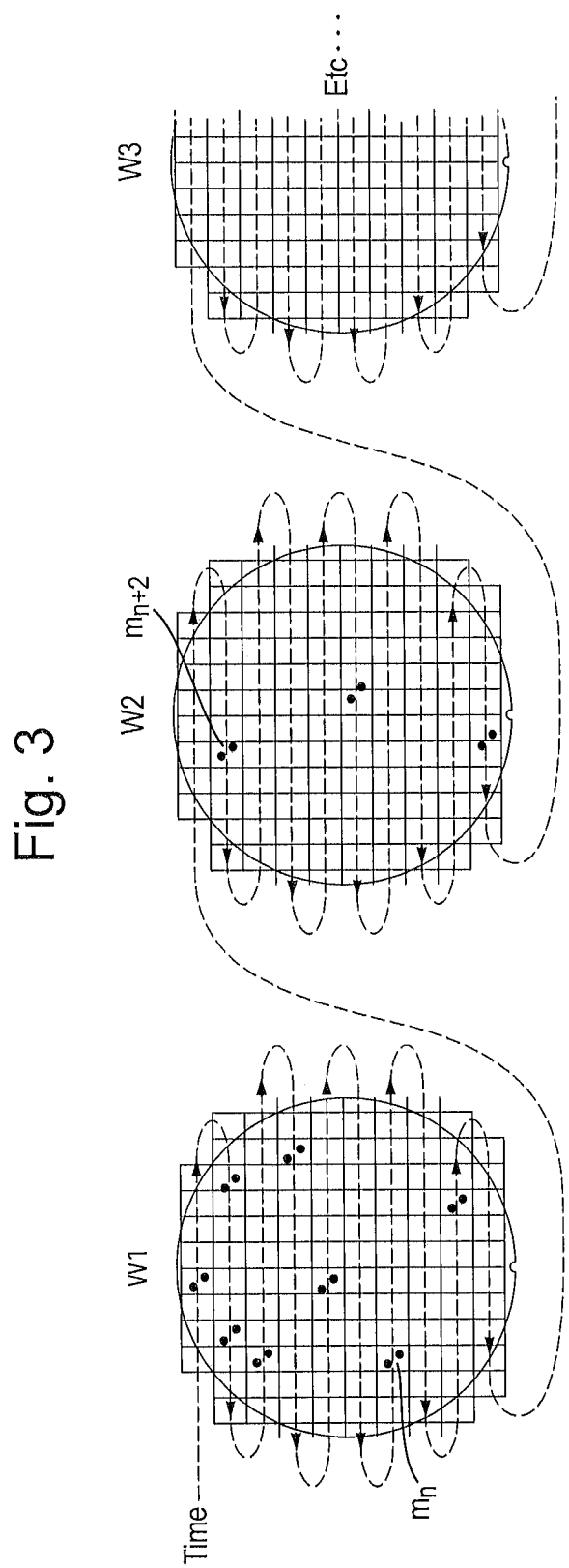
Figure 4:
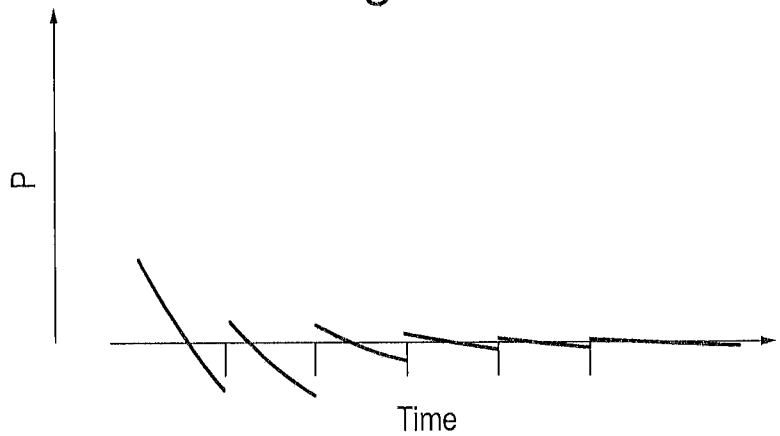
Figure 5:
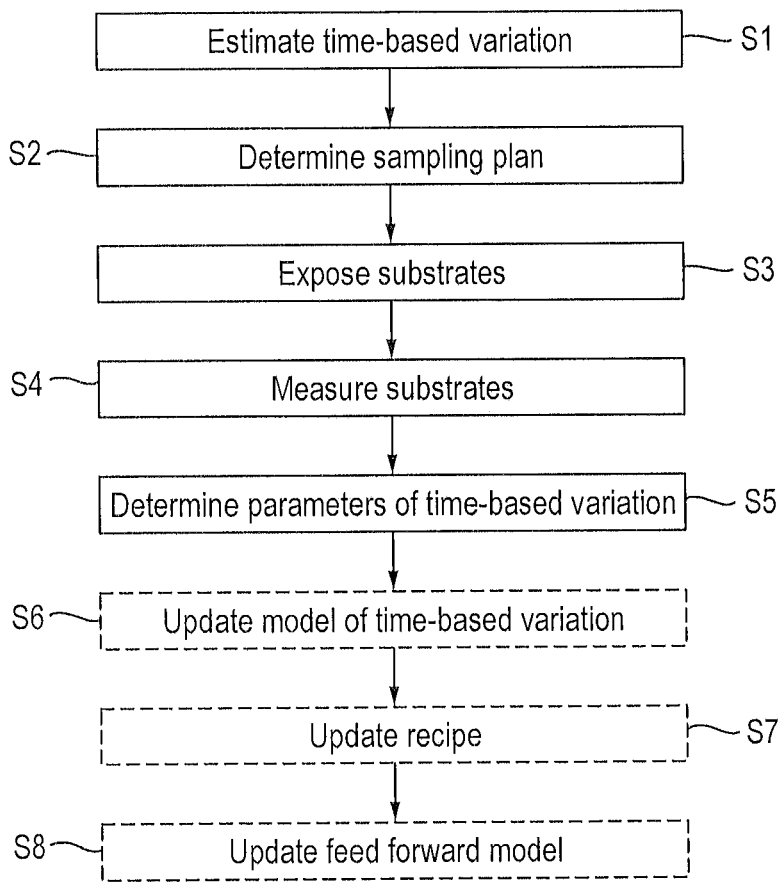

Embodiments of the invention will now be described, by way of example, with reference to the accompanying drawings in which:

FIG. 1 depicts an embodiment of a lithographic apparatus together with other apparatuses forming a production facility for, e.g., semiconductor devices;

FIG. 2 schematically depicts a time-varying process parameter and measurements of that parameter;

FIG. 3 schematically depicts a sequence of measurements during the course of exposure of a batch of substrates;

FIG. 4 schematically depicts a time-varying process parameter where corrections are made between substrates; and FIG. 5 schematically depicts a process of device manufacturing according to an embodiment of the invention.

DETAILED DESCRIPTION

Before describing embodiments of the invention in detail, it is instructive to present an example environment in which embodiments of the present invention may be implemented.

FIG. 1 illustrates a typical layout of a device (e.g., semiconductor device) production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features should be within certain tolerances. Position errors may occur due to an overlay error (often referred to as "overlay"). The overlay is the error in placing a first product feature within a first layer relative to a second product feature within a second layer or the error in placing a first product feature relative to a second product feature within a same layer. The lithographic apparatus minimizes the overlay errors by aligning each substrate accurately to a reference prior to patterning. This is done by measuring 102 positions of alignment marks which are applied to the substrate. Based on the alignment measurements the substrate position is controlled during the patterning process in order to prevent occurrence of, e.g., overlay errors.

An error in a critical dimension (CD) of the product feature may occur when, e.g., the applied dose associated with the exposure 104 is not within specification. For this reason the lithographic apparatus 100 should be able to accurately control, e.g., the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus reduces or minimizes these focal position errors by measuring 102 the substrate surface topography using a level sensor prior to patterning. Substrate height corrections are applied during subsequent patterning to help assure correct imaging (focusing) of the patterning device onto the substrate.

To help assess the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a production facility, lithographic apparatus 100 and metrology apparatus 140 form part of a "litho cell" or "litho cluster". The litho cluster also comprises typically a coating apparatus 108 configured to apply photosensitive resist to substrates W, a baking apparatus 110, a developing apparatus 112 configured to develop the exposed pattern into a physical resist pattern, an etching station 122, an apparatus 124 configured to perform a post-etch annealing step and/or possibly one or more further processing apparatuses 126.

The metrology apparatus is configured to inspect substrates after development (112) or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated to help give maximum throughput and/or product yield. A control mechanism is the feedback 146 of the metrology apparatus 140 to the various apparatus (via the SCS), in particular to the lithographic apparatus 100. Based on the characteristics of the metrology feedback, one or more corrective actions are determined to improve processing quality of one or more subsequent substrates.

The performance of a lithographic apparatus is conventionally controlled and corrected by methods such as advanced process control (APC) described for example in United States Patent Application Publication No. US2012-008127, which is incorporated herein in its entirety by reference. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is effective in suppressing, e.g., drift phenomena associated with the lithographic apparatus.

The processing of metrology data to corrective actions performed by the processing apparatus is helpful to device manufacturing. In addition to the metrology data also characteristics of individual patterning devices, substrates, one or more processing apparatuses and/or other context data may be needed to further improve or optimize the manufacturing process. For example context data relating to CD errors on a reticle may be used to control one or more various apparatuses (a lithographic apparatus, an etching station, etc.) such that the CD errors will not significantly affect the yield of the manufacturing process. Subsequent metrology data may then be used to verify the effectiveness of the control strategy and further corrective actions may be determined.

Lithographic processes can be sensitive to conditions prevailing in a lithographic apparatus at the time of exposure. Therefore lithographic apparatuses have control systems, often including both feed forward and feedback control loops, to help maintain uniform conditions and/or to provide compensating effects. Nevertheless, some process parameters, e.g. overlay and focus, may still exhibit variations as a function of substrate (wafer) and target portion (field) exposure sequence. It is likely that some of these variations result from thermal effects in the lithographic apparatus, for example so-called "lens heating" which derives from absorption of energy from the projection beam in elements of the projection system. With the continual desire to form smaller features in the lithographic industry (shrink) the residual effects after existing control and compensation systems become more and more serious.

Existing feed-forward solutions based on a calibration/setup and a feed-forward model that uses a limited number of parameters, e.g. the applied dose, have a finite accuracy. Residual offsets remain. Although these offsets are small, they are systematic and add linearly to the performance numbers. The residual effects show up as a drift through a lot (or batch) of a process parameter. A typical example of such a drifting parameter is depicted in FIG. 2.

As can be seen from FIG. 2, the (thermal) effect on the process parameter p is expected to vary as a function of time. A model that describes the variation of the process parameter p as a function of time 't' can be defined. In many cases, the process parameter p exhibits an exponential decay of the form:

$$p = \mu e^{-t/\tau} \qquad (1)$$

wherein the coefficients $\mu$ and $\tau$ can be determined empirically or theoretically. Other known parameters that can be included in the model include applied exposure dose, patterning device (e.g., reticle) transmission and/or any other factors affecting the power flow in the apparatus. It should be noted that the time variation of the process parameter may be described by other functions than an exponential decay. The time variation of the process parameter may be an increase with time rather than a decrease. The time variation of the process parameter need not be monotonic and can be cyclic.

Given a function describing the time variation of the process parameter, it is desirable to accurately characterize the variation. In general, this involves measurements of the process parameter, to provide data to improve the fit of the function describing the time variation of the process parameter. Since measurements of the process parameter take time it is desirable to minimize the number of measurements that are taken while still obtaining a good fit to the time variation of the process parameter. According to an embodiment of the present invention, based on an initial estimate of the form of the function and the coefficients that define the time-based variation of the process parameter (in the example exponential decay characterized by coefficients $\mu$ and $\tau$) and a desired number of samples, optimal sample moments $m_i$ can be computed. Sample moments $m_n$ to $m_{n+3}$ are depicted in FIG. 2.

The sample moments need not be, and generally are not, evenly spaced in time. The distribution of the sample moments depends on the form of the function to be fitted to the time variation of the process parameter. The interval between sample moments may be inversely related (e.g. inversely proportional) to the predicted rate of change of the process parameter or to the predicted magnitude of the process parameter (in the case of an exponential decay this amounts to the same). In the case of a cyclic variation, the frequency of the sample moments may be related to, desirably more than twice, the frequency of the variation of the process parameter.

Once a set of sample moments has been determined, a corresponding set of metrology target locations on the substrates through the lot can be selected as indicated in FIG. 3. Measurements $m_n$ to $m_{n+3}$ are distributed across substrates W1 to W2, and other measurements may continue onto substrate W3 and/or subsequent substrates in the batch. In some cases, if the method is carried out early in the design procedure, it may be possible to position a suitable marker to measure the process parameter at exactly the most suitable position. In most cases, it will instead be necessary to select a suitable marker that is closest to the optimum position from amongst a plurality of markers already defined in the recipe. Given that a large number of markers are usually present in a recipe it will in general be possible to select a marker that is sufficiently close to optimal position to allow for accurate fitting. In particular, in most cases it is sufficient to select markers for measurement at the level of the field or target portion and is not necessary to specify specific markers within a field in order to achieve the desired accuracy of fit.

With the exponential decay model of the example, more samples will be selected on the 1st substrate of a lot to optimally capture the model parameters. Also within the substrate the sampling is adjusted by taking into account the exposure routing. The sampling plan determined to fit the time variation can be combined with other sampling plans determined for models of intra-substrate and/or intra-field variations.

A further approach is to use existing measurements of the process parameter and combine them with knowledge of the time that the respective markers were imaged to derive a prediction of the time-based variation of the process parameter. The knowledge of the time of exposure of the measured markers can be derived from knowledge of the order of exposure of target portions within the substrate (which is sometimes referred to as the scan trajectory) and the sequence of exposure of substrates within a batch. The existing measurements may not be optimally selected for determination of the time-based variation but if the measurements are obtained for some other purpose then there is no time penalty in their re-use for the purposes of an embodiment of the present invention.

In some cases, compensatory or corrective actions may take place during a batch, e.g. in between substrates. For example, a calibration measurement using a fiducial is made between substrates and an operating parameter of the lithographic apparatus is adjusted accordingly. The effect of this on the measured process parameter is that its time-based variation becomes discontinuous, as illustrated in FIG. 4. In this event, it is desirable to take into account the effect of the corrections in deriving a model of the time-based variation of the process parameter. Additional data that can be used when fitting the time-based variation are the data from internal measurements of the lithographic apparatus.

Having determined a sufficiently accurate fit for the time-based variation of the process parameter, various different remedial actions can be taken. In particular, the improved fit can be used to update the parameters of a feedforward model in a control system of the lithographic apparatus. Alternatively or in addition, additional corrections (per substrate and/or per target portion) can be introduced via a feedback control loop. In some circumstances it may be possible to take remedial action in the subsequent processing of the substrates measured.

A method according to an embodiment of the invention is depicted in FIG. 5. The method comprises:

S1: estimating a form of a time-based variation of a process parameter

S2: determining a sampling plan

S3: exposing a plurality of substrates, including markers necessary to carry out the sampling plan S4: measuring the process parameter on the substrates according to the sampling plan S5: determine accurate values for one or more parameters of the time-based variation S6 (optional): update a model of the time-based variation S7 (optional): update a recipe for exposure of the substrates S8 (optional): update a feed forward model for the process parameter in a control system of the lithographic apparatus.

Examples of process parameters to which an embodiment of the present invention can be applied include: overlay, CD, CDU, sidewall angle, line edge roughness and/or focus. Markers and measurement techniques suitable for measuring these parameters are known in the art.

While specific embodiments of the invention have been described above, it will be appreciated that the invention may be practiced otherwise than as described.

An embodiment may include a computer program containing one or more sequences of machine-readable instructions configured to instruct one or more apparatuses as depicted in FIG. 1 to perform one or more steps of a method described herein and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Further embodiments of the invention are disclosed in the list of numbered clauses below:

1. A method of monitoring a device manufacturing process, the method comprising:

obtaining an estimated time variation of a process parameter;

determining, on the basis of the estimated time variation, a sampling plan for measurements to be performed on a plurality of substrates to obtain information about the process parameter;

measuring substrates in accordance with the sampling plan to obtain a plurality of measurements; and determining an actual time variation of the process parameter on the basis of the measurements.

2. A method according to clause 1, wherein determining the sampling plan comprises predicting a rate of change of the process parameter at different times during the exposure of a batch of substrates and generating a sampling plan such that the interval between measurements is inversely related to the rate of change of the process parameter.

3. A method according to clause 1 or 2, wherein determining the sampling plan comprises predicting a magnitude of errors due to variations in the process parameter during the exposure of a batch of substrates and generating a sampling plan such that the interval between measurements is inversely related to the magnitude of the errors.

4. A method according to any of clauses 1 to 3, wherein the sampling plan comprises positions on one or more substrates of a batch for measurements to be made, the positions being determined with reference to a trajectory of the substrates during exposures and an order of exposure of substrates in the batch.

5. A method of monitoring a device manufacturing process, the method comprising:

measuring a substrate at a plurality of positions on one or more substrates of a batch of substrates to obtain a plurality of measurements relating to a process parameter;

determining the relative times of exposures of the positions on the one or more substrates with reference to a trajectory of substrates during exposures and/or an order of exposure of substrates in the batch; and determining an actual time variation of the process parameter on the basis of the measurements and the relative times.

6. A method according to any of the preceding clauses, wherein the process parameter is dependent on temperature of a part of the lithographic apparatus.

7. A method according to any of the preceding clauses, wherein determining an actual time variation additionally takes account of any changes in operating parameters of the lithographic apparatus during exposures of the one or more substrates.

8. A method according to any of the preceding clauses, wherein the process parameter is selected from the group consisting of: overlay, CD, CDU, sidewall angle, line edge roughness and focus.

9. A method according to any of the preceding clauses, further comprising adjusting a control system of the lithographic apparatus on the basis of the determined actual time variation.

10. A method according to any of the preceding clauses, further comprising adjusting a recipe for exposure and/or processing of substrates on the basis of the determined actual time variation.

11. A device manufacturing method comprising:

performing a sequence of exposures on one or more substrates using a lithographic apparatus;

monitoring the exposures using a method according to any of the preceding clauses;

adjusting a control parameter of the lithographic apparatus on the basis of the determined actual time variation; and performing further exposures on one or more substrates using the lithographic apparatus.

12. A computer program comprising computer readable code configured to instruct one or more lithographic tools to perform a method according to any of the preceding clauses.

13. An inspection apparatus configured for measuring a property of a substrate, the inspection apparatus comprising:

an illumination system configured to illuminate a substrate with radiation;

a detection system configured to detect scattering properties arising from the illumination; and a processor configured to control the inspection apparatus to perform a method according to any of clauses 1 to 8.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of monitoring a device manufacturing process, the method comprising:
    obtaining an estimated time variation of a process parameter;
    determining, on the basis of the estimated time variation, a sampling plan for measurements to be performed on a plurality of substrates to obtain information about the process parameter;
    measuring substrates in accordance with the sampling plan to obtain a plurality of measurements; and
    determining an actual time variation of the process parameter on the basis of the measurements.

2. The method according to claim 1, wherein determining the sampling plan comprises predicting a rate of change of the process parameter at different times during the exposure of a batch of substrates and generating a sampling plan such that the interval between measurements is inversely related to the rate of change of the process parameter.

3. The method according to claim 1, wherein determining the sampling plan comprises predicting a magnitude of errors due to variations in the process parameter during the exposure of a batch of substrates and generating a sampling plan such that the interval between measurements is inversely related to the magnitude of the errors.

4. The method according to claim 1, wherein the sampling plan comprises positions on one or more substrates of a batch for measurements to be made, the positions being determined with reference to a trajectory of substrates during exposures and/or an order of exposure of substrates in the batch.

5. The method according to claim 1, wherein the process parameter is dependent on temperature of a part of a lithographic apparatus.

6. The method according to claim 1, wherein determining an actual time variation additionally takes account of any changes in operating parameters of a lithographic apparatus during exposures of the one or more substrates.

7. The method according to claim 1, wherein the process parameter is selected from the group consisting of: overlay, CD, CDU, sidewall angle, line edge roughness and focus.

8. The method according to claim 1, further comprising adjusting a control system of a lithographic apparatus and/or a recipe for exposure and/or processing of substrates on the basis of the determined actual time variation.

9. A device manufacturing method comprising:
    performing a sequence of exposures on one or more substrates using a lithographic apparatus;
    monitoring the exposures using the method according to claim 1;
    adjusting a control parameter of the lithographic apparatus on the basis of the determined actual time variation; and
    performing further exposures on one or more substrates using the lithographic apparatus.

10. A non-transitory computer-readable medium comprising computer readable code configured to instruct a processor system to at least:
    obtain an estimated time variation of a process parameter of a device manufacturing process;
    determine, on the basis of the estimated time variation, a sampling plan for measurements to be performed on a plurality of substrates to obtain information about the process parameter;
    obtain a plurality of measurements from measurement of substrates in accordance with the sampling plan; and
    determine an actual time variation of the process parameter on the basis of the measurements.

11. The computer-readable medium according to claim 10, wherein the instructions configured to instruct one or more tools to determine the sampling plan are further configured to instruct one or more tools to predict a rate of change of the process parameter at different times during the exposure of a batch of substrates and generate a sampling plan such that the interval between measurements is inversely related to the rate of change of the process parameter.

12. The computer-readable medium according to claim 10, wherein the instructions configured to instruct one or more tools to determine the sampling plan are further configured to instruct one or more tools to predict a magnitude of errors due to variations in the process parameter during the exposure of a batch of substrates and generating a sampling plan such that the interval between measurements is inversely related to the magnitude of the errors.

13. The computer-readable medium according to claim 10, wherein the sampling plan comprises positions on one or more substrates of a batch for measurements to be made, the positions being determined with reference to a trajectory of substrates during exposures and/or an order of exposure of substrates in the batch.

14. An inspection apparatus configured to measure a property of a substrate, the inspection apparatus comprising:
    an illumination system configured to illuminate a substrate with radiation;
    a detection system configured to detect scattering properties arising from the illumination; and
    the computer-readable medium according to claim 10.

15. A method of monitoring a device manufacturing process, the method comprising:
    measuring a substrate at a plurality of positions on one or more substrates of a batch of substrates to obtain a plurality of measurements relating to a process parameter;
    determining the relative times of exposures of the positions on the one or more substrates with reference to a trajectory of substrates during exposures and/or an order of exposure of substrates in the batch; and
    determining an actual time variation of the process parameter on the basis of the measurements and the relative times.

16. The method according to claim 15, wherein the process parameter is dependent on temperature of a part of a lithographic apparatus.

17. The method according to claim 15, wherein determining an actual time variation additionally takes account of any changes in operating parameters of a lithographic apparatus during exposures of the one or more substrates.

18. The method according to claim 15, wherein the process parameter is selected from the group consisting of: overlay, CD, CDU, sidewall angle, line edge roughness and focus.

19. The method according to claim 15, further comprising adjusting a control system of a lithographic apparatus on the basis of the determined actual time variation.

20. The method according to claim 15, further comprising adjusting a recipe for exposure and/or processing of substrates on the basis of the determined actual time variation.

21. A non-transitory computer-readable medium comprising computer readable code configured to instruct one or more tools to perform the method according to claim 15.

* * * * *